United States Patent [19]
Fairchild et al.

[11] Patent Number: 5,506,824
[45] Date of Patent: Apr. 9, 1996

[54] FREQUENCY MODULATION TO BIPHASE DATA CONVERSION FOR WRITABLE CD ATIP DATA

[75] Inventors: Michael G. Fairchild, Webster; Gzim Derti, Dansville, both of N.Y.

[73] Assignee: Eastman Kodak Company, Rochester, N.Y.

[21] Appl. No.: 359,680

[22] Filed: Dec. 20, 1994

[51] Int. Cl.$^6$ .................................................. G11B 7/00
[52] U.S. Cl. .................. 369/48; 369/50; 369/54; 369/59; 369/124
[58] Field of Search .................. 369/47, 48, 49, 369/50, 53, 54, 58, 59, 124, 44.13

[56] References Cited

U.S. PATENT DOCUMENTS

| | | | |
|---|---|---|---|
| 5,341,356 | 8/1994 | Dieleman et al. | 369/47 |
| 5,363,360 | 11/1994 | Fairchild | 369/48 |

*Primary Examiner*—Georgia Y. Epps
*Assistant Examiner*—Muhammad N. Edun
*Attorney, Agent, or Firm*—Raymond L. Owens

[57] ABSTRACT

A method for detecting and processing ATIP information extracted from a prerecorded wobbled groove formed in a compact disk is disclosed. The prerecorded wobbled groove has a plurality of blocks of information. The method includes extracting an FM signal from the wobbled groove and providing a high frequency phase-lock loop which responds to the extracted FM signal to produce a high frequency clock. The method further includes converting such FM signal into biphase data by sampling and latching the FM ATIP signal from the wobbled groove; and digitally comparing a predetermined count value to a count value derived from the high frequency clock and the FM signal. It further includes extracting a clock signal from a digital phase-lock loop responsive to the biphase data; and providing an ATIP decoder which in response to the biphase data, biphase clock, and high frequency clock signal provides sync detection and address information.

1 Claim, 7 Drawing Sheets

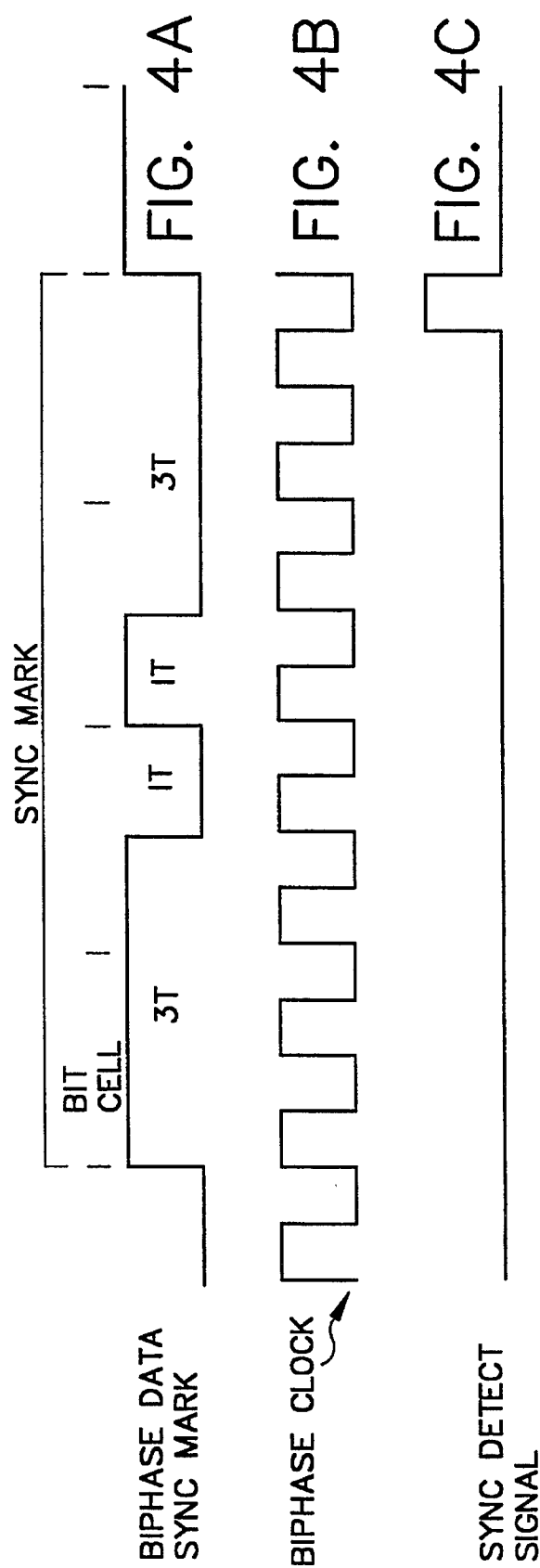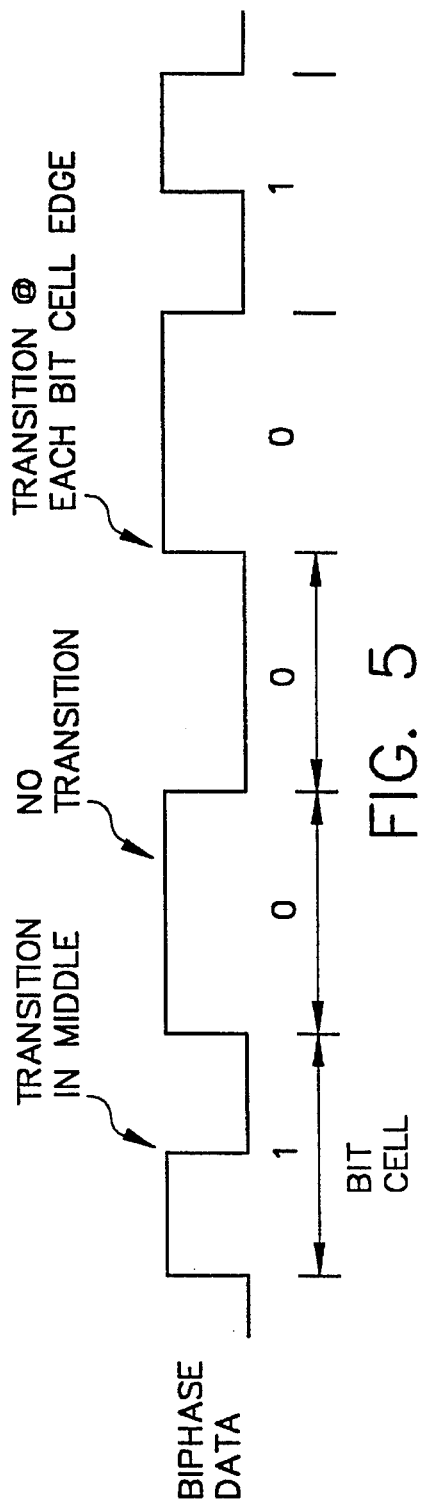

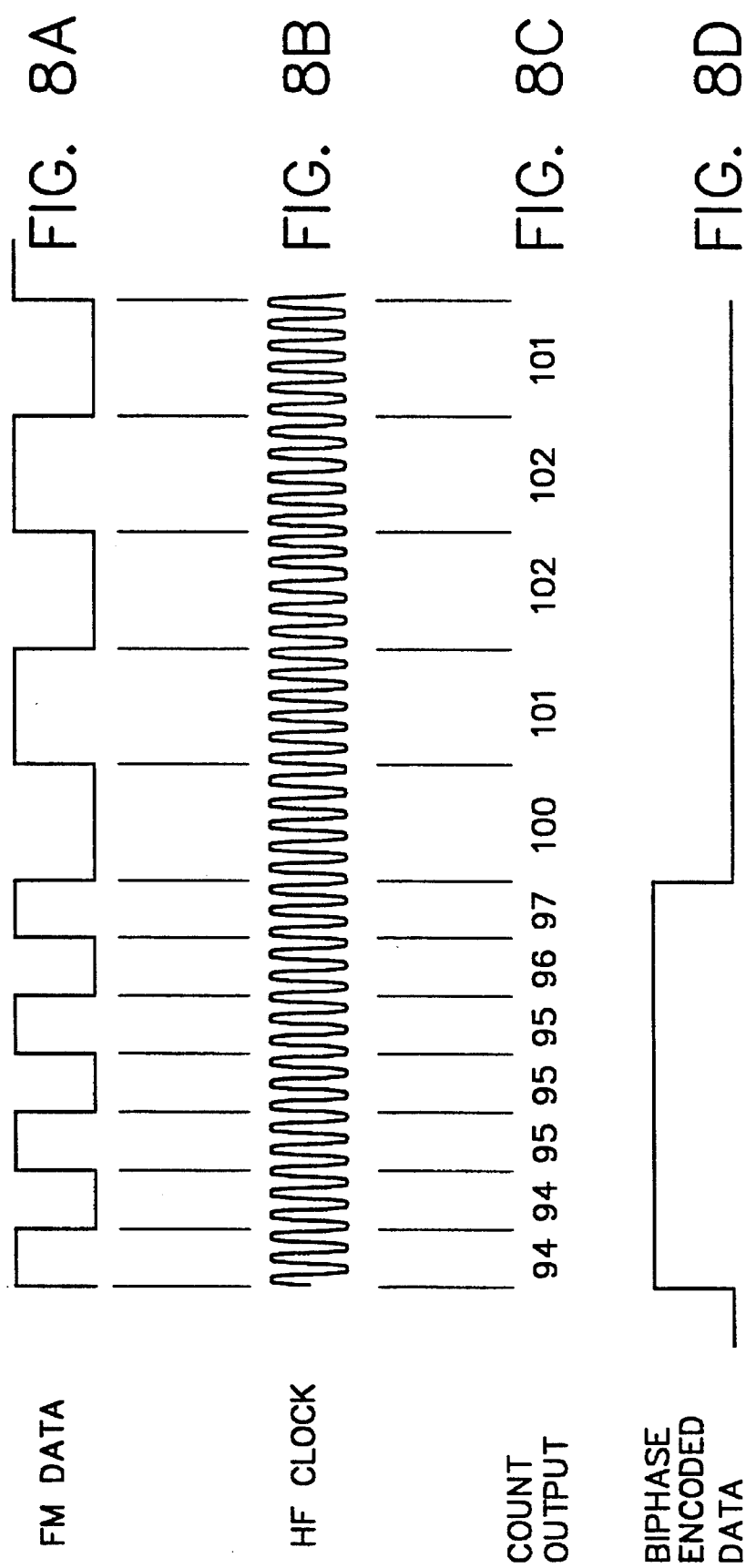

BIPHASE ENCODED DATA

PULSE FOR EACH EDGE

INJECTED PULSES

UNINTERRUPTED DATA STREAM TO DPLL

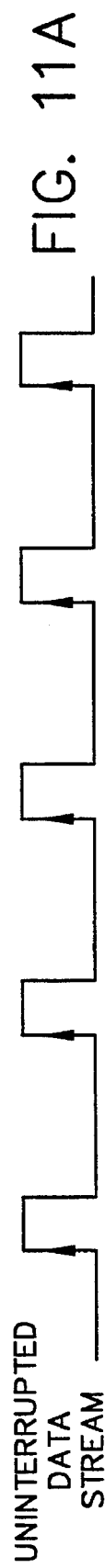
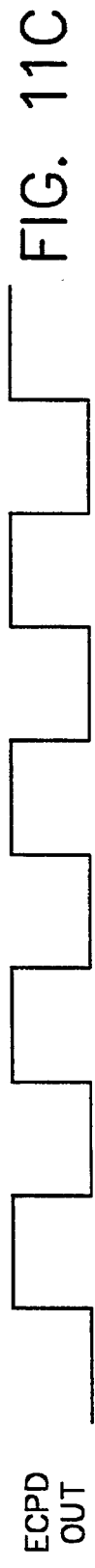
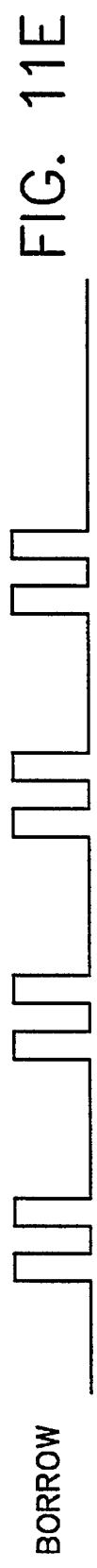
FIG. 11A UNINTERRUPTED DATA STREAM
FIG. 11B FEEDBACK CLOCK
FIG. 11C ECPD OUT
FIG. 11D HF CLOCK
FIG. 11E BORROW
FIG. 11F CARRY

FREQUENCY MODULATION TO BIPHASE DATA CONVERSION FOR WRITABLE CD ATIP DATA

CROSS REFERENCE TO RELATED APPLICATION

Reference is made to commonly assigned U.S. application Ser. No. 08/320,995 filed Oct. 10, 1994 by Fairchild et al, entitled "Method for Detecting and Processing Synchronization Marks Extracted from a Prerecorded Wobbled Groove on a Compact Disk", the disclosure of which is incorporated herein by reference.

FIELD OF THE INVENTION

The present invention relates to the detection and processing of Absolute Time In Pregroove (ATIP) information extracted from a compact diskrecordable (CD-R) disk, particularly involving the frequency modulation (FM) to biphase data conversion method.

BACKGROUND OF THE INVENTION

Stamped by machine on a writable compact disk is a wobbled groove. The groove provides means for tracking on the disk while writing or reading data that is written in the groove. The wobbled groove, which is a frequency modulated signal after detection and processing, contains addressing o and other information that are necessary for the write and read processes of a CD writer/reader.

Information is coded in a series of blocks, each of said blocks comprising 42 bits: four bits of a sync mark, eight bits of "minutes", eight bits of "seconds", eight bits of "frames", and fourteen bits of "CRC" (cyclic redundancy check). For a more complete discussion of this coded information and its extraction see commonly assigned U.S. Pat. No. 5,363,360, issued Nov. 8, 1994 to Fairchild. In any event to extract the information from the wobbled groove, the following process is necessary:

1. The laser beam associated with the optical head uses a tracking servo to attempt to follow the wobbled groove, but the servo is bandwidth limited to approximately 5 Khz. At a 6X CD data rate, the wobbled groove frequency is 132.3 Khz. Obviously, the tracking servo cannot follow the wobbled groove which creates an error voltage in the tracking error signal. The error signal is filtered and amplified to produce a TTL level, frequency modulated signal called ATIP FM data.

2. The ATIP FM data is input to a demodulating phase locked loop which extracts biphase encoded data (biphase data rate=18.9 Kbps).

3. The biphase encoded data is input to another phase locked loop which recovers a 2X clock (2X clock frequency=37.8 Khz).

4. The biphase encoded data and the 2X clock are input to an ATIP decoder which detects the sync mark, converts the biphase encoded data to NRZ (non-return to zero) data, and provides the status of the ATIP subsystem.

Unfortunately, the phase locked loops which are necessary for demodulation and clock recovery are constructed using analog design and components. The components require extensive printed circuit board space and add cost to a CD writer/reader. In addition, the demodulating phase locked loop adds considerable delay to the biphase encoded data relative to the physical location of the data on the disk.

SUMMARY OF THE INVENTION

It is therefore an object of this invention to provide an efficient and cost effective way to decode ATIP FM data without substantial biphase encoded data delay. This object is achieved in a method for detecting and processing ATIP information extracted from a prerecorded wobbled groove formed in a compact disk the prerecorded wobbled groove having a plurality of blocks of information, the method comprising the steps of:

(a) extracting an FM signal from the wobbled groove;

(b) providing a high frequency phase-lock loop which responds to the extracted FM signal to produce a high frequency clock;

(c) converting such FM signal into biphase data by:
  (i) sampling and latching the FM ATIP signal from the wobbled groove; and
  (ii) digitally comparing a predetermined count value to a count value derived from the high frequency clock and the FM signal;

(d) extracting a clock signal from a digital phase-lock loop responsive to the biphase data; and (e) providing an ATIP decoder which in response to the biphase data, biphase clock, and high frequency clock signal provides sync detection, address information, and ATIP decoder status.

The following are advantages of the present invention. The method according to the invention is particularly advantageous in that high speed CD reading and writing capabilities are permitted. In addition, a pure digital solution for FM to biphase conversion and a digital phase locked loop for clock recovery permit easier ASIC integration; this reduces cost and increases reliability. Finally, the delay through the FM to biphase encoded data demodulation process is substantially reduced to improve the timing relationship between the biphase encoded data and the information embedded in the wobbled groove. Other advantages will appear during the detailed description which follows.

BRIEF DESCRIPTION OF THE DRAWINGS

FIGS. 4a–c represent different signals illustrating the generation of synchronization signals according to the invention;

FIG. 5 describes the biphase data decoding process;

FIGS. 8a–d show timing diagrams for the FM to biphase converter of FIG. 7;

FIGS. 11a–f show timing diagrams for the operation of the digital phase lock loop in FIG. 9.

DETAILED DESCRIPTION OF THE PREFERRED EMBODIMENTS

Figure 1:
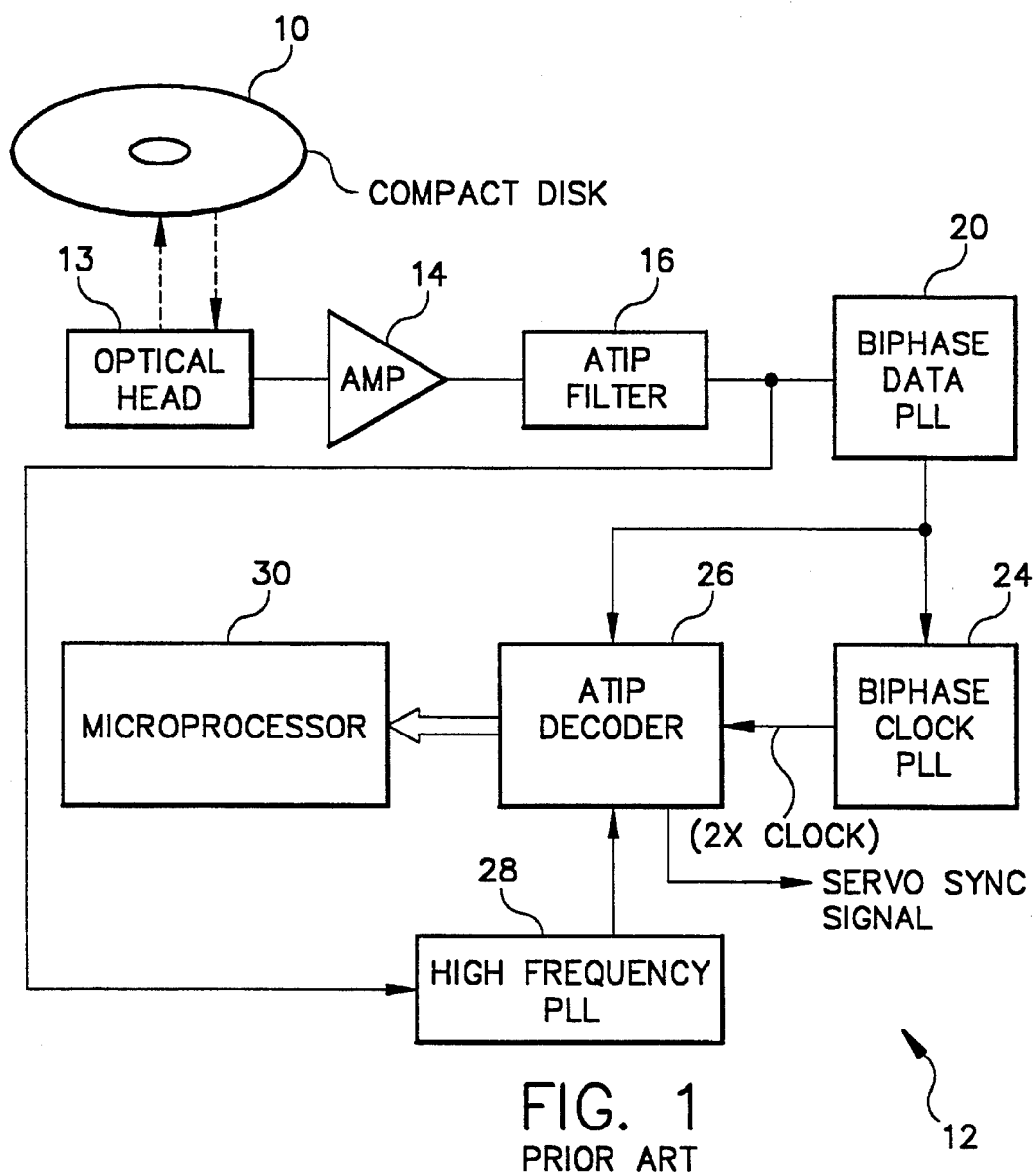
FIG. 1 is a diagram in block format of a prior art system for detecting and processing sync marks and address information abstracted from a wobbled groove of a compact disk.

FIG. 1 is a block diagram in accordance with the prior art. A prerecorded spiraled wobbled pregroove, starting from the center of a CD-R (compact disk-recordable) disk 10 and extending up to the periphery of the CD-R disk 10 is read by a writer/reader 12. Typically, a writer/reader 12 such as the Philips 2X® writer/reader or the Kodak 6X writer/reader can be used. This pregroove is not a perfect spiral but is wobbled with a typical amplitude of 30 nm and a spatial period of 54 to 64 min.

Figure 2:
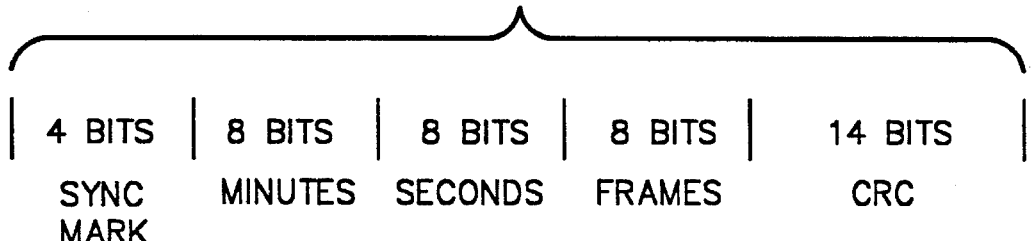
FIG. 2 illustrates the organization of one block of ATIP data on the writable compact disk.

This spiraled wobbled pregroove contains ATIP (Absolute Time in Pregroove) information, such as addressing and other information that are necessary for the write and read processes of the CD-R writer/reader 12. This ATIP information is encoded in blocks (see FIG. 2) of 42 bits: 4 bits of synchronization mark, 24 bits of address (8 bits of "minutes", 8 bits of "seconds", and 8 bits of "frames"), and 14 bits of CRC (cyclic redundancy check) which are used for error detection.

Figure 3A:
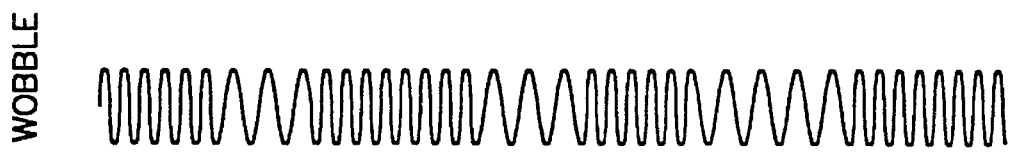
FIGS. 3a–c illustrate different signals which are used for generating the synchronization signals with the method according to the invention.

A FM (frequency modulated) signal is produced from the reading of the spiral wobbled groove. This signal is shown in FIG. 3A. On this representation, the frequency differences have been exaggerated to better show the modulation of the signal.

Figure 3B:

In FIG. 1 (prior art), the writer/reader 12 includes an optical head 13 which processes light signals reflected from the CD-R disk 10 or writes optical data onto the CD-R disk 10 preferably in the middle of the wobbled groove. The ATIP signal read from the CD-R disk 10 is an FM signal which is amplified by an amplifier 14. An ATIP filter 16 responds to the amplified FM signal to produce a narrow band, frequency modulated TTL level signal (the FM modulated signal). The signal issued from the ATIP filter 16 is then sent to a biphase encoded data PLL (phase locked loop) 20 known as a demodulator in the art which outputs an error voltage which in effect is the phase difference between the frequency modulated input and a voltage controlled oscillator output. The error voltage is processed within the biphase encoded data PLL 20 and produces biphase encoded data (see FIG. 3B). Note that at this point in the process, there is approximately 50 µs of delay @ a 6X data rate between the biphase encoded data and the point at which the data was detected on the CD-R disk 10. This is highly undesirable. Some of the delay (approximately 30 µs) is inherent within the ATIP filter 16; the demodulator contributes approximately 20 µs of delay.

Figure 3C:
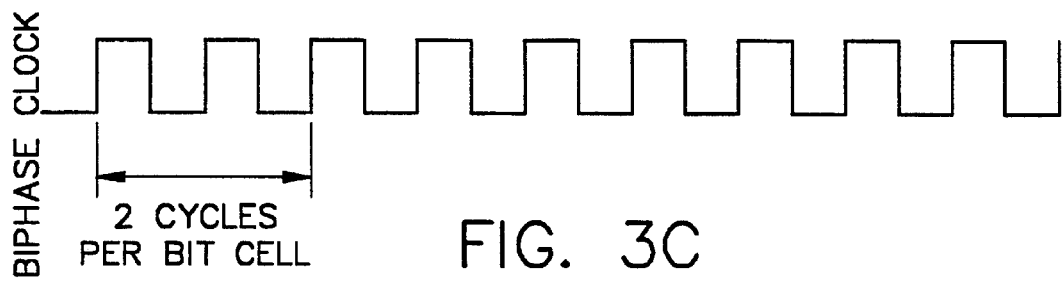

The biphase encoded data is sent to a Biphase Clock PLL 24 which recovers a 2X clock from the biphase encoded data (see FIG. 3C). For each bit within the biphase data there are two biphase clock cycles. Every two clock cycles generates a bit cell. The bit cell phase relationship with respect to the biphase encoded data is controlled by the detection of the synchronization mark which occurs at the beginning of each ATIP block (see FIGS. 4a–c).

The biphase rules which are illustrated in FIG. 5 and are typically used for producing the NRZ (non-return to zero) data follow: a transition in the middle of a bit cell is a "one", no transition in a bit cell is a "zero", and a transition must occur at each bit cell edge. Thus, "legal" lengths 1T and 2T of biphase encoded data normally exist. A third length, designated as "illegal" (3T) is used to detect the sync mark at the beginning of each ATIP block (see FIG. 4a). The biphase encoded data is decoded using the biphase clock into NRZ data. The NRZ data are registered and checked for errors using CRC (cyclic redundancy check). At this point, the NRZ ATIP data is binary coded decimal (BCD) format; a microprocessor converts the BCD format to binary data for further processing. According to a preferred embodiment, the address information is actually an absolute time on the CD-R disk 10 that increases monotonically from inner diameter to outer. The optical head 13 and associated circuitry read the stamped time code to determine location on the CD-R disk 10.

Figure 6:
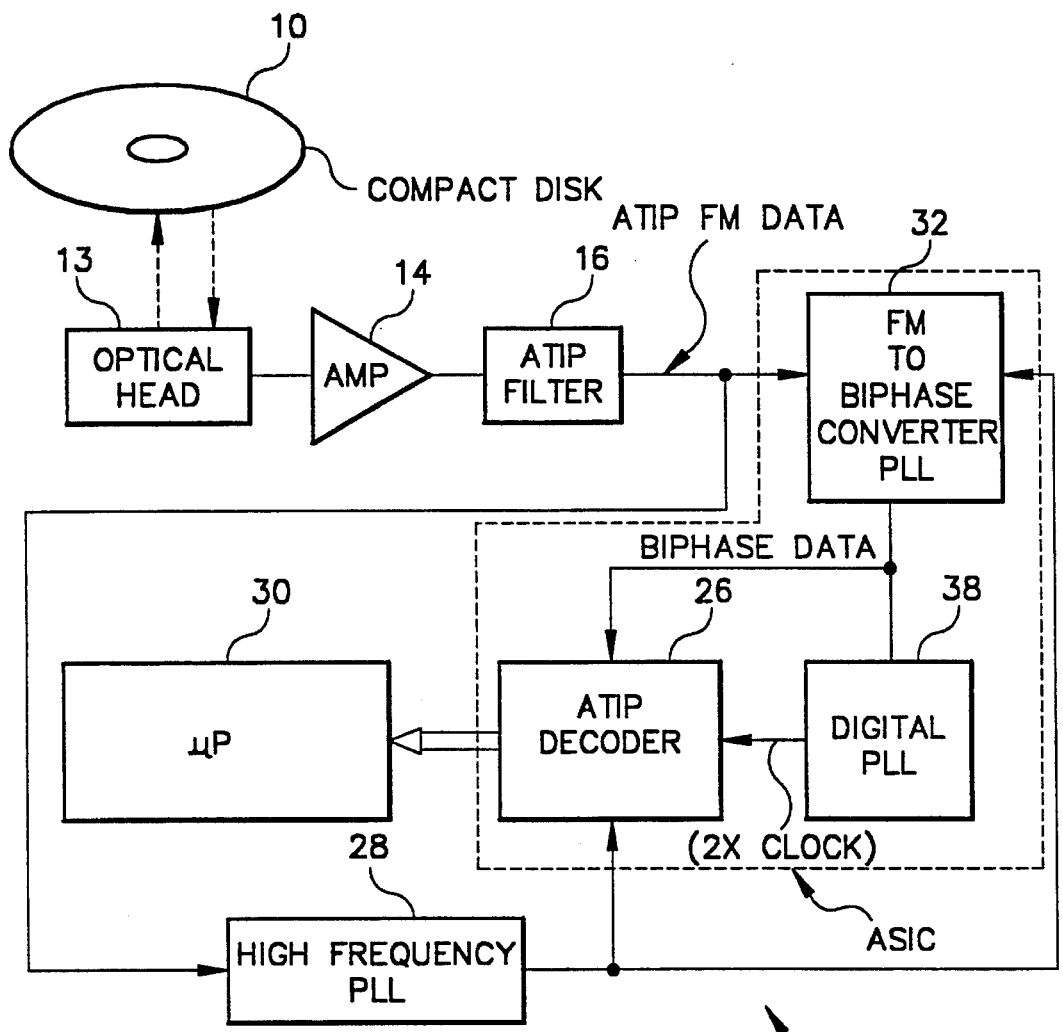
FIG. 6 is a diagram in block format of a system in accordance with the invention for detecting and processing sync marks and address information abstracted from a wobbled groove of a compact disk.
Figure 7:
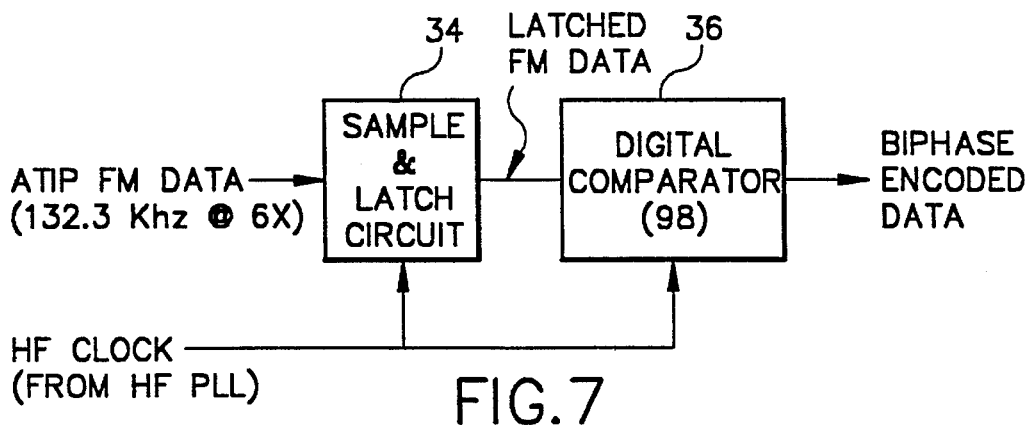
FIG. 7 is a more detailed block diagram of the FM to biphase converter of FIG. 6.

Now, turn attention to the invention (refer to FIG. 6). A similar process as the prior art is used to develop the ATIP FM Data. Where parts correspond to FIG. 1, the same numbers will be used. The ATIP FM data (132.3 Khz@6X) produced by the ATIP filter 16 is sent to a FM to biphase converter 32 (shown in more detail in FIG. 7). Turning to FIG. 7, the ATIP FM data is sampled and latched in circuitry 34 using the high frequency clock provided by the high frequency phase lock loop 28. This phase lock loop 28 varies in frequency with respect to the rotational speed of the CD-R disk 10. The high frequency clock nominally runs at a 6X data rate of 25.9308 MHz. (Note that FIG. 8b is shown for effect and is not to scale). A digital comparator 36 is then used to count the number of high frequency clock cycles that occur in each half cycle of the FM data. (See FIGS. 8a–d) Typically, (25.9308 MHz÷132.3 Khz)÷2=98 clock cycles in each half cycle of the FM data carrier frequency. The modulation is ±6 Khz, therefore the number of clock cycles can vary between 94 and 102 as calculated below:

(25.9308 *MHz*÷138.3 *Khz*)÷2≈94 clock cycles (25.9308 *MHz*÷126.3 *Khz*)÷2≈102 clock cycles Each count associated with each half cycle of the FM data is compared to the nominal count of the FM carrier frequency which in this example is 98. If the count of one half cycle is 94, 95, 96, 97, or 98, a "one" is output from the digital comparator 36; if the count of one half cycle is 99, 100, 101, or 102, a "zero" is output from the digital comparator 36. By registering the strings of "ones" and "zeroes", a pulse train is constructed which is the biphase encoded data (see FIG. 8d). Note that this process of converting the FM data to biphase encoded data involves no analog processing; it is strictly digital which eases the ASIC integration flow. Note also that the delay attributed to the FM to biphase conversion process is basically one half cycle of the FM data (≈3.78 µs@a 6X data rate).

Figure 9:
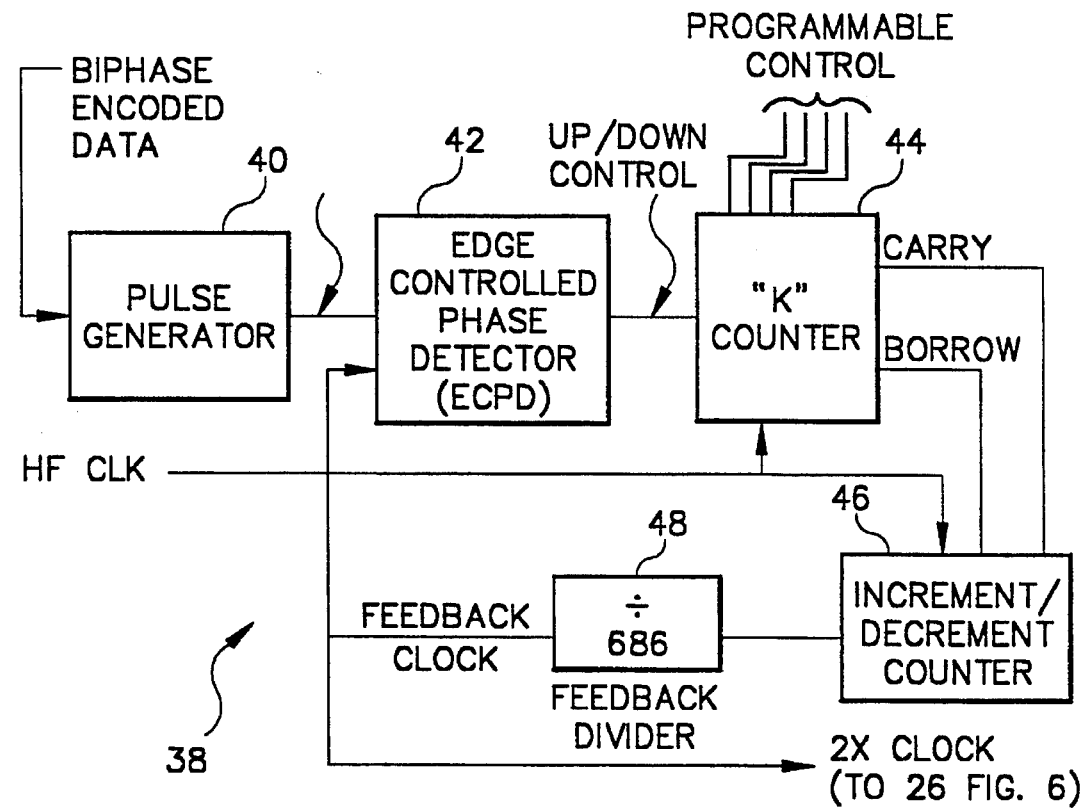
FIG. 9 is a more detailed block diagram of the digital phase lock loop of FIG. 6.
Figure 10A:
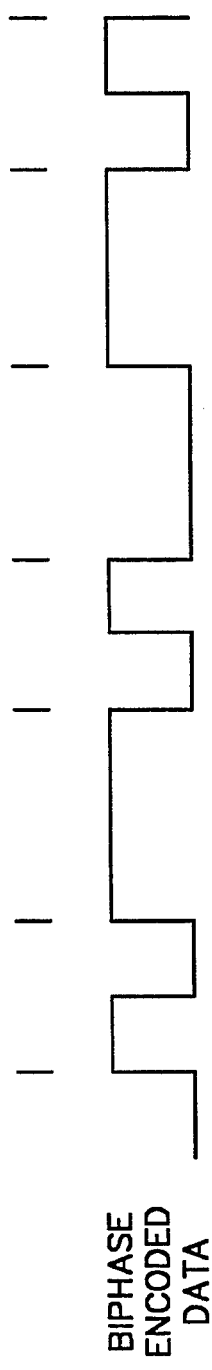
FIGS. 10a–d show timing diagrams for input to an operation of the pulse generator of FIG. 9.
Figure 10B:
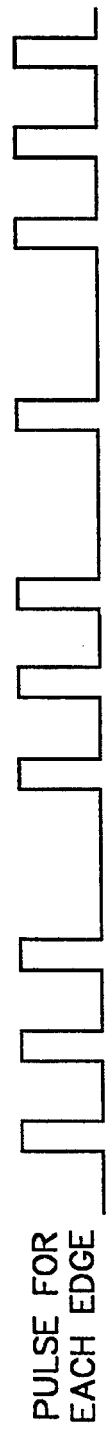
Figure 10C:
Figure 10D:
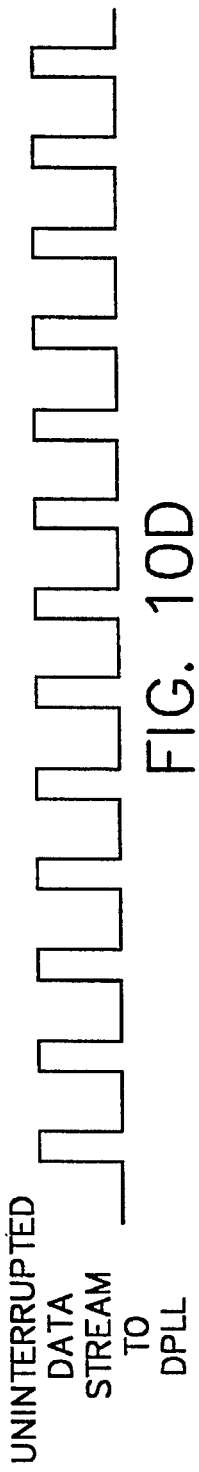

Now that the biphase encoded data has been extracted, it is necessary to recover a 2X clock (See FIG. 4b) in order to decode the biphase encoded data. This is accomplished by using a digital phase locked loop 38 (DPLL)(shown in FIG. 6). The DPLL is shown in detail in FIG. 9 and is divided into five subsections: the pulse generator 40, an edge-controlled phase detector 42, a "K" counter 44, an "I/D" counter 46, and the feedback divider 48. The pulse generator 40 accomplishes two functions; it produces a pulse (See FIG. 10b) for each edge of the biphase encoded data (See FIG. 10a) and injects a pulse (See FIG. 10c) when necessary to provide an uninterrupted data stream (See FIG. 10d) to the edge-controlled phase detector 42 (ECPD). The ECPD 42 cannot tolerate a pulse width modulated data stream (see FIG. 10a). The uninterrupted data stream (18.9 Khz@6X) is input to the ECPD 42 which outputs the leading or lagging phase difference between the input data stream and the feedback clock (See FIG. 11b) provided by the feedback divider 48 network (see FIGS. 9 and 11). The lead or lag phase difference is actually output as an "up" or "down" control for the "K" counter 44. The "K" counter will be understood to those skilled in the art to be a programmable counter that counts up or down depending on its input from the edge controlled phase detector. The "K" counter 44 as shown can be adjusted by an operator by changing inputs on a programmable control. In effect the "K" counter 44 can be programmed to adjust the response of the digital phase lock loop 38 to perturbations.

If the "K" counter 44 cycles "up", the counter output is a "carry" pulse for an Increment/Decrement counter 46; if the "K" counter 44 cycles "down", the counter output is a "borrow" pulse for the increment/decrement counter 46. The frequency of the "carry" and "borrow"0 pulses is controlled by the number of count stages in the "K" counter 44. If the programmable control is set to a minimum number (3), the "K" counter 44 permits fast acquisition and a wide lock range (as well as substantial clock jitter); a maximum number (7) of "K" counter 44 stages increases acquisition time and decreases lock range (minimized clock jitter), therefore, a compromise is necessary. Simulations have shown optimal count stage to be five; this allows reasonable time for the DPLL 38 to acquire phase lock as well as maintain a sufficient lock range for the system. The capability also exists to lock quickly using three counter stages within the "K" counter 44, then the counter stages can be modified dynamically to the optimal number of counter stages. The "carry" and "borrow" pulses are input to the increment/decrement counter 46; the increment/decrement counter 46 responds by adding or deleting pulses from the increment/decrement counter 46 clock stream in order to maintain the appropriate phase relationship between the input data and feedback clock provided to the edge controlled phase detector (ECPD) 42. It will be noted that the feedback clock is also the 2x clock which is input into the ATIP decoder 26 in FIG. 6. Normally, if no "carry" or "borrow" pulses exist, the increment/decrement counter 46 output is a clock which runs at one-half the high speed clock frequency (12.9654 MHz@6X). The increment/decrement counter output 46 is provided as an input to the feedback divider 48 (a divide-by-686 network) which generates the feedback clock for the ECPD 42. The feedback clock frequency is calculated as follows:

$$12.9654 \ MHz \div 686 = 18.9 \ Khz$$

Returning to FIG. 6, as the biphase encoded data varies in frequency, the DPLL 38 compensates for any change in frequency to maintain the proper biphase data to 2x clock relationship so the system functions properly.

Now that the biphase encoded data and the 2X clock have been processed, the same decoding procedure can be followed as described in the prior art.

While the invention has been described with particular reference to a preferred embodiment, it will be understood by those skilled in the art that various changes may be made and equivalents may be substituted for elements of the preferred embodiments without departing from the claimed invention.

Parts List
10 CD-R disk
12 writer/reader
13 optical head
14 amplifier
16 ATIP filter
20 phase lock loop
24 biphase clock PLL
28 high frequency phase lock loop
32 FM to biphase converter
34 sample and latch circuitry
36 digital comparator
38 digital phase lock loop
40 pulse generator
42 edge controlled phase detector
44 "K" counter
46 increment/decrement counter
48 feedback divider

What is claimed is:

1. A method for detecting and processing ATIP information extracted from a prerecorded wobbled groove formed in a compact disk the prerecorded wobbled groove having a plurality of blocks of information, the method comprising the steps of:

(a) extracting an FM signal from the wobbled groove;

(b) providing a high frequency phase-lock loop which responds to the extracted FM signal to produce a high frequency clock;

(c) converting such FM signal into biphase data by:
   (i) sampling and latching the FM ATIP signal from the wobbled groove; and
   (ii) digitally comparing a predetermined count value to a count value derived from the high frequency clock and the FM signal;

(d) extracting a clock signal from a digital phase-lock loop responsive to the biphase data; and (e) providing an ATIP decoder which in response to the biphase data, biphase clock, and high frequency clock signal provides sync detection and address information.

\* \* \* \* \*